(12) United States Patent
Kodama

(10) Patent No.: US 8,947,971 B2
(45) Date of Patent: Feb. 3, 2015

(54) SEMICONDUCTOR DEVICE GENERATING A CLOCK SIGNAL WHEN REQUIRED

(75) Inventor: Takuyo Kodama, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 395 days.

(21) Appl. No.: 13/314,033

(22) Filed: Dec. 7, 2011

(65) Prior Publication Data

US 2012/0155212 A1 Jun. 21, 2012

(30) Foreign Application Priority Data

Dec. 16, 2010 (JP) ................................. 2010-280422

(51) Int. Cl.
*G11C 8/18* (2006.01)
*G11C 11/406* (2006.01)
*G11C 7/22* (2006.01)
*G11C 7/10* (2006.01)
*G11C 11/4076* (2006.01)

(52) U.S. Cl.
CPC .......... *G11C 7/222* (2013.01); *G11C 11/40615* (2013.01); *G11C 7/1042* (2013.01); *G11C 11/4076* (2013.01)
USPC .............. 365/233.1; 365/233.11; 365/233.12; 365/233.13

(58) Field of Classification Search
USPC ............... 365/233.1, 233.11, 233.12, 233.13, 365/233.14, 189.011, 194
See application file for complete search history.

(56) References Cited

U.S. PATENT DOCUMENTS

| | | | |
|---|---|---|---|
| 6,489,819 B1 * | 12/2002 | Kono et al. .................... | 327/141 |
| 6,768,698 B2 | 7/2004 | Kono | |
| 7,006,404 B1 * | 2/2006 | Manapat et al. ......... | 365/189.14 |
| 7,336,116 B2 | 2/2008 | Hirata et al. | |
| 7,880,504 B2 | 2/2011 | Iwai | |
| 8,013,645 B2 | 9/2011 | Kuroki et al. | |
| 2003/0085748 A1 * | 5/2003 | Ryu ............................... | 327/291 |
| 2006/0209620 A1 * | 9/2006 | Deivasigamani et al. .... | 365/233 |
| 2006/0221761 A1 * | 10/2006 | Wallner et al. ................ | 365/233 |
| 2007/0217270 A1 * | 9/2007 | Lee et al. .................. | 365/189.05 |
| 2008/0031055 A1 * | 2/2008 | Lee .......................... | 365/189.05 |
| 2008/0310574 A1 * | 12/2008 | Lee .............................. | 375/376 |
| 2009/0284290 A1 | 11/2009 | Kuroki et al. | |
| 2009/0302884 A1 | 12/2009 | Kawakami | |
| 2010/0231258 A1 | 9/2010 | Iwai | |

FOREIGN PATENT DOCUMENTS

| | | |
|---|---|---|
| JP | 2002-111456 A | 4/2002 |
| JP | 2003-297083 A | 10/2003 |
| JP | 2006-033058 A | 2/2006 |
| JP | 2006-109091 A | 4/2006 |
| JP | 2006-211494 A | 8/2006 |
| JP | 2009-278528 A | 11/2009 |
| JP | 2009-296548 A | 12/2009 |
| JP | 2010-219620 A | 9/2010 |

\* cited by examiner

*Primary Examiner* — Son Dinh
*Assistant Examiner* — Uyen B Tran
(74) *Attorney, Agent, or Firm* — McGinn IP Law Group, PLLC

(57) ABSTRACT

Such a device is disclosed that includes a clock generation circuit generating a first clock signal and having an output node, and a drive circuit coupled to the output node of the clock generation circuit. The clock generation circuit outputs the first clock signal from the output node to the drive circuit in a clock output mode, fixes a potential of the output node to a first level in a first clock stop mode, and fixes the potential of the output node to a second level that is different from the first level in a second clock stop mode.

8 Claims, 12 Drawing Sheets

| MODE OF THE CLOCK-OUTPUT CONTROL CIRCUIT 74 | LCLKT | LCLKB | READ_Even | READ_Odd | DQS_DATA_Even | DQS_DATA_Odd | DQS |
|---|---|---|---|---|---|---|---|
| CLOCK OUTPUT MODE | HIGH | LOW | HIGH | LOW | HIGH | HIGH | LOW(Even) |
| | HIGH | LOW | HIGH | LOW | HIGH | LOW | LOW(Even) |
| | HIGH | LOW | HIGH | LOW | LOW | HIGH | HIGH(Even) |
| | HIGH | LOW | HIGH | LOW | LOW | LOW | HIGH(Even) |
| | LOW | HIGH | LOW | HIGH | HIGH | HIGH | LOW(Odd) |
| | LOW | HIGH | LOW | HIGH | HIGH | LOW | HIGH(Odd) |
| | LOW | HIGH | LOW | HIGH | LOW | HIGH | LOW(Odd) |
| | LOW | HIGH | LOW | HIGH | LOW | LOW | HIGH(Odd) |
| FIRST CLOCK STOP MODE | HIGH | LOW | LOW | HIGH | HIGH | HIGH | Hi-impedance |
| | HIGH | LOW | LOW | HIGH | HIGH | LOW | Hi-impedance |
| | HIGH | LOW | LOW | HIGH | LOW | HIGH | Hi-impedance |
| | HIGH | LOW | LOW | HIGH | LOW | LOW | Hi-impedance |
| SECOND CLOCK STOP MODE | LOW | HIGH | HIGH | LOW | HIGH | HIGH | Hi-impedance |
| | LOW | HIGH | HIGH | LOW | HIGH | LOW | Hi-impedance |
| | LOW | HIGH | HIGH | LOW | LOW | HIGH | Hi-impedance |
| | LOW | HIGH | HIGH | LOW | LOW | LOW | Hi-impedance |

FIG.10

SEMICONDUCTOR DEVICE GENERATING A CLOCK SIGNAL WHEN REQUIRED

BACKGROUND OF THE INVENTION

1. Field of the Invention

The present invention relates to a semiconductor device, and more particularly relates to a semiconductor device that generates a clock signal when it is required.

2. Description of Related Art

Recently, DDR (Double Data Rate) type synchronous memory device used as main memory of a personal computer or the like has been used in many cases as a semiconductor device which performs an operation in synchronization with a high-speed clock signal. For such semiconductor devices, a configuration in which output timing of read data is synchronized with an external clock signal is employed. According to this configuration, data transmission/reception between a controller and a semiconductor device can be performed at timing synchronized with the external clock signal. Therefore, data transmission/reception to each other is performed without an error. By the way, since internal delay is present in the semiconductor device itself, it is necessary to generate an internal clock signal inside the semiconductor device so that the output timing of the read data can be synchronized with the external clock signal while considering the delay time. The circuit realizing that is a DLL (Delay Locked Loop) circuit.

An example of the DLL circuit is disclosed in Japanese Patent Application Laid-open No. 2009-278528. This patent application discloses stopping an operation of a DLL circuit so as to reduce power consumption of the DLL circuit during a refresh operation e.g. in which an internal clock is not used.

However, the background technique described above has a problem that aging degradation of a large number of CMOSs (Complementary Metal Oxide Semiconductors; hereinafter, these CMOSs are collectively referred to as "drive circuit") that exist on a transmission path of an internal clock signal is expedited. That is, because the internal clock signal is fixed to logical high (or logical low) even when the operation of the DLL circuit is stopped, each node in the drive circuit becomes fixed to high or low. Each of a P-channel MOS transistor and an N-channel MOS transistor that constitute each CMOS has a characteristic that the threshold voltage increases gradually as an ON state continues. This characteristic is referred to as "NBTI" (Negative Bias Temperature Instability) in the P-channel MOS transistor and "hot carrier degradation" in the N-channel MOS transistor. Due to this characteristic of each transistor, during an output of the DLL circuit is fixed to low, for example, the threshold voltage of each transistor on a side where the ON state continues increases, which causes aging degradation of the drive circuit. On the other hand, the threshold voltage of each transistor on a side where an OFF state continues is not relatively degraded. This means one of the MOS transistors in a CMOS (for example, a P-channel MOS transistor) is degraded due to the continued ON state while the other transistor (for example, an N-channel MOS transistor) is not degraded due to the continued OFF state and causes a problem such as a distortion of a duty cycle of a clock to be transmitted.

Such aging degradation of a drive circuit occurs not only in a DLL circuit for synchronizing an output timing of read data with an external clock signal. That is, even in some other types of clock generation circuits, if the generation of a clock is stopped for a certain extent of long time, similar aging degradation can occur in a drive circuit that receives a clock signal from the clock generation circuit. In addition, similar aging degradation occurs not only when the output is fixed to low, but also when it is fixed to high. Therefore, there has been a demand for a technique which can suppress aging degradation of a drive circuit that receives a clock signal from a clock generation circuit in which the generation of a clock is possibly stopped and its output is fixed to high or low.

SUMMARY

In one embodiment, there is provided a semiconductor device that includes: a clock generation circuit generating a first clock signal and having an output node; and a drive circuit coupled to the output node of the clock generation circuit. The clock generation circuit outputs the first clock signal from the output node to the drive circuit in a clock output mode, fixes a potential of the output node to a first level in a first clock stop mode, and fixes the potential of the output node to a second level that is different from the first level in a second clock stop mode.

In another embodiment, there is provided a semiconductor device that includes: a command decoder generating first and second signals; a clock signal line; and a clock generation circuit starting supplying a clock signal having a predetermined frequency to the clock signal line when the second signal is activated, driving the clock signal line to a first logic level in response to a first occurrence of deactivating the first signal, and driving the clock signal line to a second logic level different from the first logic level in response to a second occurrence of deactivating the first signal.

In another embodiment, there is provided a semiconductor device that includes: an input node configured to receive a clock signal in response to an issuance of a first command and a fix potential in response to a second command, the fix potential being changed between first and second potentials one after another each time when the second command is issued; and a control circuit coupled to the input node.

BRIEF DESCRIPTION OF THE DRAWINGS

FIG. 10 is a table indicative of an embodiment of a combination of potentials of the signals shown in FIG. 9;

DETAILED DESCRIPTION OF THE EMBODIMENTS

Preferred embodiments of the present invention will be explained below in detail with reference to the accompanying drawings.

Figure 1:
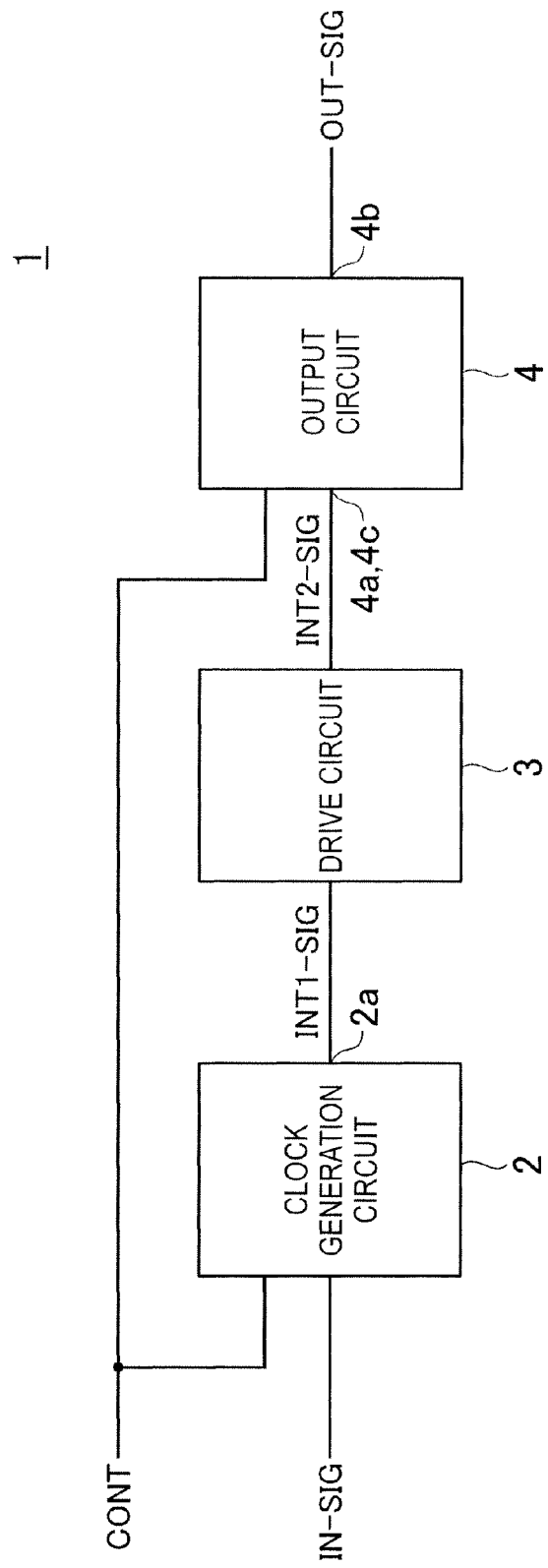
FIG. 1 is a diagram indicative of an embodiment of a system configuration of a semiconductor device 1.

Referring now to FIG. 1, the semiconductor device 1 according to a first embodiment of the present invention includes a clock generation circuit 2, a drive circuit 3, and an output circuit 4.

The clock generation circuit 2 is a circuit that receives an external clock signal IN-SIG from an oscillating circuit or the like provided outside the semiconductor device 1, generates a first clock signal INT1-SIG based on the external clock signal IN-SIG, and outputs the first clock signal INT1-SIG from an output node 2a.

The clock generation circuit 2 is configured to operate in any one of the following three operation modes. The first mode is a clock output mode in which the clock generation circuit 2 generates the first clock signal INT1-SIG and outputs the generated signal from the output node 2a. The second mode is a first clock stop mode in which the clock generation circuit 2 fixes a potential of the output node 2a to a high level (first level). The third mode is a second clock stop mode in which the clock generation circuit 2 fixes the potential of the output node 2a to a low level (second level).

The operation mode of the clock generation circuit 2 is controlled by a control signal CONT. The control signal CONT is a high active signal that takes either potential of a high level and a low level. When the control signal CONT is the high level, the clock generation circuit 2 enters into the clock output mode so that the first clock signal INT1-SIG is output from the output node 2a. On the other hand, when the control signal CONT is the low level, the clock generation circuit 2 enters into the first and second clock stop modes in an alternate manner. As a result, the potential of the output node 2a repeatedly becomes the high level and the low level in an alternate manner while going through a period in which the first clock signal INT1-SIG is output between the first and second clock stop modes.

The drive circuit 3 is a circuit that is constituted by a plurality of CMOSs connected in series. The drive circuit 3 buffers the first clock signal INT1-SIG from the clock generation circuit 2 via at least a CMOS, and outputs the buffered signal as a second clock signal INT2-SIG to the output circuit 4.

As described above, each of the P-channel MOS transistor and the N-channel MOS transistor constituting each CMOS has a characteristic such that the threshold voltage increases gradually as an ON state continues (the NBTI and the hot carrier degradation). This can be evaluated as aging degradation of each of the transistors. In the semiconductor device 1, the potential of the output node 2a of the clock generation circuit 2 repeatedly becomes a low level and a high level in an alternate manner when the clock generation circuit 2 does not output the first clock signal INT1-SIG. In the background art, when the clock generation circuit 2 does not output a clock, the transistors in CMOSs are completely divided into two groups: a group A through which ON currents continue to flow and a group B which remain in OFF states. Therefore, only the transistors of the group A heavily deteriorate. In contrast to this, in the semiconductor device 1, both the transistors which had belonged to the group A and the transistors which had belonged to the group B repeats the ON state and the OFF state in an alternate manner. Therefore, it becomes possible to distribute the amount of degradation on all the transistors, and the amount of degradation per unit time which one transistor is subjected comes down. Accordingly, it becomes possible to suppress aging degradation as a whole of the drive circuit 3.

The output circuit 4 is configured to include an input terminal 4a, an output terminal 4b, and a clock terminal 4c and is a circuit that outputs a signal for output which is input to the input terminal 4a, in synchronization with a clock signal that is input to the clock terminal 4c, to the output terminal 4b. In the first embodiment, as shown in FIG. 1, the input terminal 4a also serves as the clock terminal 4c, and both the signal for output and the clock signal are the second clock signal INT2-SIG. A signal output from the output terminal 4b is an output signal OUT-SIG.

The control signal CONT described above is also input to the output circuit 4. The output circuit 4 has a function of electrically disconnecting the input terminal 4a and the output terminal 4b when the control signal CONT is low, that is, when the clock generation circuit 2 is in either one of the first and second clock stop modes. This function is provided to prevent a malfunction of a circuit at the subsequent stage of the output circuit 4 (a circuit to which the output signal OUT-SIG is input, not shown in the drawings).

That is, in the semiconductor device 1, each time the control signal CONT makes a transition to a low level, the first clock signal INT1-SIG repeatedly becomes a high level and the low level in an alternate manner, by which the distribution of the amount of degradation is realized. Furthermore, if a circuit is designed not to operate (its output is in an inactive state) when a certain input signal is a low level, the circuit is generally designed to operate (its output is in an active state) when the certain input signal is a high level. In contrast to this, the output circuit 4 is designed to hold its output in an inactive state when the control signal CONT is a low level, regardless of the logical level of the second clock signal INT2-SIG which corresponds the above-mentioned certain input signal.

As explained above, in the semiconductor device 1, the first clock signal INT1-SIG outputted from the clock generation circuit 2 is not fixed to high or low, but is changed from one level to the other according to the transition of the control signal CONT (although the inactive state is represented by a transition to a low level in the first embodiment, it is also possible to represent the inactive state by a transition to a high level). Therefore, it is possible to suppress aging degradation of the drive circuit 3 that receives the first clock signal INT1-SIG. Furthermore, it is also possible to prevent a malfunction of a circuit at the subsequent stage of the output circuit 4 because the output circuit 4 holds its output signal OUT-SIG in an inactive state in response to the control signal CONT regardless of the level of the first clock signal INT1-SIG.

Figure 2:
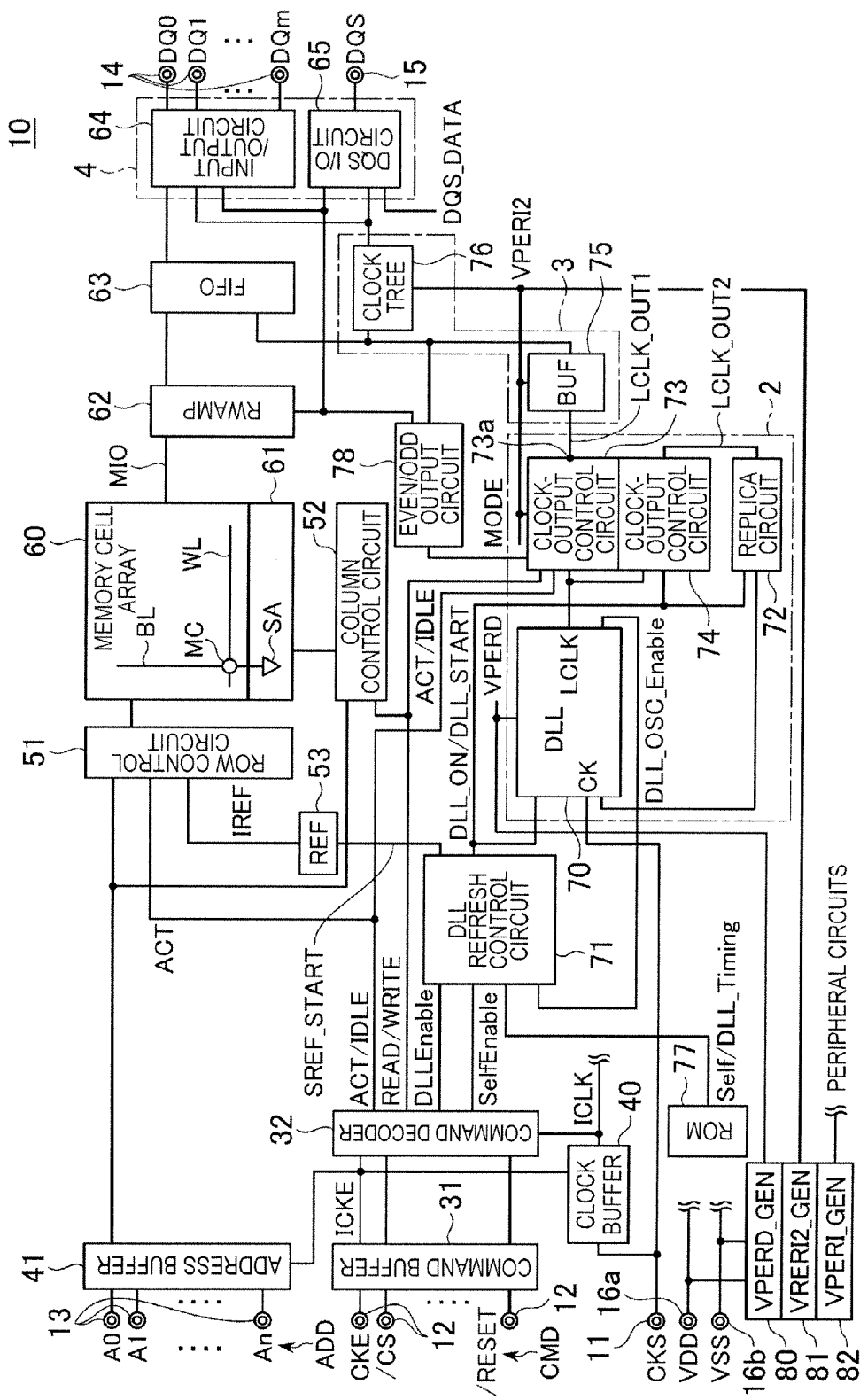
FIG. 2 is a block diagram indicative of an embodiment of an overall configuration of a semiconductor device 10.

Turning to FIG. 2, The semiconductor device 10 according to a second embodiment of the present invention is a DDR SDRAM (Synchronous Dynamic Random Access Memory), and includes a clock terminal 11, a command terminal 12, an address terminal 13, a data input/output terminal 14, a data strobe terminal 15, and power-supply terminals 16a and 16b, as external terminals.

The clock terminal 11 is a terminal to which an external clock signal CKS is supplied. The supplied external clock signal CKS is then supplied to a clock buffer 40 and a DLL circuit 70. The clock buffer 40 generates a single-phase internal clock signal ICLK based on the external clock signal CKS, and supplies the generated signal to a command decoder 32 and other circuits that are not shown in the drawings.

The DLL circuit 70 is a circuit that receives the external clock signal CKS and generates an internal clock signal LCLK subjected to phase control with respect to the external clock signal CKS and also duty control. The generated internal clock signal LCLK is supplied to a clock-output control circuit 73 (first clock-output control circuit) and a clock-output control circuit 74 (second clock-output control circuit).

The DLL circuit 70 has a function of determining whether each of a phase and a duty ratio of the internal clock signal LCLK reaches a target value (whether it is locked) and a function of activating, when it is determined that the phase and the duty ratio are locked, an oscillator enable signal DLL_OSC_Enable. The oscillator enable signal DLL_OSC_Enable is supplied to a DLL refresh control circuit 71.

The clock-output control circuit 73 is a circuit that generates an internal clock signal LCLK_OUT1 while switching the operation mode according to the activation state of an active command ACT and a read command READ (both are described later), and outputs the generated internal clock signal LCLK_OUT1 to an output node 73a. The operation mode includes the three operation modes explained in the first embodiment. In the clock output mode, the internal clock signal LCLK_OUT1 generated based on the internal clock signal LCLK is output from the output node 73a. In the first clock stop mode, a potential of the output node 73a is fixed to a high level. In the second clock stop mode, the potential of the output node 73a is fixed to a low level. The output potential of the output node 73a is supplied to an even/odd output circuit 78 and is further supplied to a FIFO 63 and a clock tree 76 via a buffer circuit 75. The clock tree 76 is a circuit that distributes the supplied internal clock signal LCLK_OUT1 to an input/output circuit 64 and a DQS input/output circuit 65.

The clock-output control circuit 73 also has a function of generating mode information MODE that indicates its operation mode. The generated mode information MODE is supplied from the clock-output control circuit 73 to the even/odd output circuit 78.

The even/odd output circuit 78 is a circuit that has a function of generating a read even signal READ_Even and a read odd signal READ_Odd based on the mode information MODE and the internal clock signal LCLK_OUT1 supplied from the clock-output control circuit 73.

To specifically explain the function of the even/odd output circuit 78, the even/odd output circuit 78 first converts the internal clock signal LCLK_OUT1 supplied from the clock-output control circuit 73 into complementary internal clock signals LCLKT and LCLKB. When the clock-output control circuit 73 is in the clock output mode, the even/odd output circuit 78 outputs the internal clock signal LCLKT as the read even signal READ_Even and the internal clock signal LCLKB as the read odd signal READ_Odd. On the other hand, when the clock-output control circuit 73 is in the first clock stop mode or the second clock stop mode, the even/odd output circuit 78 outputs the internal clock signal LCLKB as the read even signal READ_Even and the internal clock signal LCLKT as the read odd signal READ_Odd. The read even signal READ_Even and the read odd signal READ_Odd are supplied to the output circuit 4 to be used to prevent a malfunction of a circuit at the subsequent stage of the output circuit 4. This point will be explained later.

The clock-output control circuit 74 is a circuit that generates an internal clock signal LCLK_OUT2 while switching the operation mode according to the activation state of a DLL ON signal DLL_ON and a DLL start signal DLL_START (both are described later), and outputs the generated internal clock signal LCLK_OUT2 to a replica circuit 72. This operation mode also includes the three operation modes explained in the first embodiment. In the clock output mode, the internal clock signal LCLK_OUT2 generated based on the internal clock signal LCLK is output to the replica circuit 72. In the first clock stop mode, an output of the replica circuit 72 is fixed to a high level. In the second clock stop mode, the output of the replica circuit 72 is fixed to a low level.

The replica circuit 72 is a circuit that performs pseudo-replication of the drive circuit 3. The internal clock signal LCLK_OUT2 input to the replica circuit 72 is supplied to the DLL circuit 70 while receiving a delay and a waveform change that are substantially the same as those received by the internal clock signal LCLK_OUT1 while passing through the drive circuit 3.

The DLL circuit 70, the replica circuit 72, and the clock-output control circuits 73 and 74 explained above correspond to a part of the clock generation circuit 2 explained in the first embodiment, and the buffer circuit 75 and the clock tree 76 correspond to the drive circuit 3 explained in the first embodiment. Furthermore, the input/output circuit 64 and the DQS input/output circuit 65 that receive the distribution of the internal clock signal LCLK_OUT1 from the clock tree 76 correspond to the output circuit 4 explained in the first embodiment. Further, the control signal CONT explained in the first embodiment corresponds to the active command ACT and the read command READ in the second embodiment.

The command terminal 12 is a terminal to which various command signals CMD, such as a clock enable signal CKE, a row-address strobe signal /RAS, a column-address strobe signal /CAS, a write enable signal /WE, a chip select signal /CS, an on-die termination signal CDT, a reset signal /RESET, are supplied. The signals having signal names that begin with "/" in the present specification mean inverted signals of their corresponding signals or active low signals.

The command signals CMD supplied to the command terminal 12 are supplied to a command buffer 31. These command signals CMD supplied to the command buffer 31 are buffered and supplied to the command decoder 32. The clock enable signal CKE is also supplied to the clock buffer 40 and an address buffer 41 as an internal clock enable signal ICKE. The clock buffer 40 and the address buffer 41 are configured to operate when the internal clock enable signal ICKE is activated and not to operate when the internal clock enable signal ICKE is deactivated.

The command decoder 32 is a circuit that generates various internal commands by holding, decoding, and counting the command signals CMD. The internal commands include a DLL enable command DLLEnable instructing activation/deactivation of the DLL circuit 70 and a self-refresh command SelfEnable instructing start/stop of self refresh of a memory cell array 60, as well as various commands related to read/write of a memory cell, such as the active command ACT, an idle command IDLE, the read command READ, and a write command WRITE.

Each of the internal commands generated by the command decoder 32 is supplied to each circuit in the semiconductor device 10. Specifically, the active command ACT is supplied to a row control circuit 51, the active command ACT and the read command READ are supplied to the clock-output control circuit 73, the read command READ is supplied to a column control circuit 52, and the DLL enable command DLLEnable and the self-refresh command SelfEnable are supplied to the DLL refresh control circuit 71.

The address terminal 13 is a terminal to which an address signal ADD constituted by n+1 address bits A0 to An is supplied, and the supplied address signal ADD is supplied to the address buffer 41. The address signal ADD supplied to the address buffer 41 is latched, a row address is supplied to the row control circuit 51, and a column address is supplied to the column control circuit 52. Furthermore, when an entry is made to a mode register set, the address signal ADD is supplied to a mode register (not shown), by which contents of the mode register are updated.

The row control circuit 51 is a circuit that selects any one of word lines WL included in the memory cell array 60 based on the row address supplied from the address buffer 41. In the memory cell array 60, a plurality of word lines WL and a plurality of bit lines BL intersect with each other, and a memory cell MC is arranged at each of the intersections (only one word line WL, one bit line BL, and one memory cell MC are shown in FIG. 2). Each of the bit lines BL is connected to a corresponding sense amplifier SA in a sense circuit 61.

The column control circuit 52 is a circuit that selects any one of sense amplifiers SA included in the sense circuit 61. The sense amplifier SA selected by the column control circuit 52 is connected to a read/write amplifier (RWAMP) 62 via a main I/O line MIO.

In a read operation, read data DQ amplified by the sense amplifier SA is further amplified by the read/write amplifier 62, and output to outside from the data input/output terminal 14 via the FIFO 63 and the input/output circuit 64. On the other hand, in a write operation, write data DQ input from outside via the data input/output terminal 14 is input to the read/write amplifier 62 via the FIFO 63 and the input/output circuit 64, and supplied to the sense amplifier SA after being amplified.

The data input/output terminal 14 is a terminal for performing an output of the read data DQ and an input of the write data DQ. In the semiconductor device 10, m+1 data input/output terminals 14 are provided, where m≥0, so that data of m+1 bits can be input or output simultaneously.

The FIFO 63 is a first-in first-out circuit that performs queuing of the read data DQ or the write data DQ, and is provided in each of the data input/output terminals 14. To explain the FIFO 63 with its read operation, the read data DQ output from the read/write amplifier 62 is distributed to each of the data input/output terminals 14 by a multiplexer (not shown) and queued in the corresponding FIFO 63. The FIFO 63 outputs the queued read data DQ to the input/output circuit 64 at a timing synchronized with the internal clock signal LCLK.

The input/output circuit 64 is configured to include an output circuit (first output circuit) and an input circuit provided in each of the data input/output terminals 14. To explain the input/output circuit 64 with its read operation, the input/output circuit 64 shapes the read data DQ output from the corresponding FIFO 63, and outputs the shaped read data DQ to outside from the corresponding data input/output terminal 14 at a timing synchronized with the internal clock signal LCLK_OUT1.

The data strobe terminal 15 is a terminal for performing input/output of a data strobe signal DQS that serves as an operation reference of data input/output between the DQS input/output circuit 65 and an external controller. The DQS input/output circuit 65 is configured to include an output circuit (second output circuit) and an input circuit provided in each of the data input/output terminals 14.

In the write operation, the data strobe signal DQS is input to the DQS input/output circuit 65 from outside via the data strobe terminal 15. The DQS input/output circuit 65 controls a timing at which the input/output circuit 64 loads the write data DQ from the data input/output terminal 14, based on the data strobe signal DQS that is input in the above manner.

On the other hand, in the read operation, a data-strobe data even signal DQS_DATA_Even and a data-strobe data odd signal DQS_DATA_Odd (output signal) with a half clock shifted from each other are supplied to the DQS input/output circuit 65 from the inside the semiconductor device 10. These signals support a so-called "2-bit prefetch configuration (or 4-bit to 8-bit prefetch configuration), and each of the signals has 1-bit information in a time length of one clock. The DQS input/output circuit 65 outputs each of the signals at an interval of a half clock from the data strobe terminal 15. A timing for the output is determined in synchronization with the internal clock signal LCLK_OUT1 supplied from the clock tree 76.

The read odd signal READ_Odd and the read even signal READ_Even are also supplied to the DQS input/output circuit 65 from the even/odd output circuit 78 described above. The DQS input/output circuit 65 is configured to maintain, when the clock-output control circuit 73 is in the first clock stop mode or the second clock stop mode, the data strobe terminal 15 in a high impedance state by performing a process based on those signals. This point will be explained later.

The DLL refresh control circuit 71 is a circuit that controls a timing at which the memory cell array 60 performs self refresh and a timing at which the DLL circuit 70 boots up. Data Self_Timing that indicates an interval of self refresh and data DLL_Timing that indicates an interval for a regular start of the DLL circuit 70, as well as the DLL enable command DLLEnable, the self-refresh command SelfEnable, and the oscillator enable signal DLL_OSC_Enable described above, are supplied from a ROM 77 to the DLL refresh control circuit 71. These data are written in the ROM 77 at the time of manufacturing.

Regarding the DLL circuit 70, first, the DLL refresh control circuit 71 activates the DLL ON signal DLL_ON that indicates the activating period of DLL while the input DLL enable command DLLEnable is activated, and deactivates the DLL ON signal DLL_ON for the rest. The DLL ON signal DLL_ON is supplied to the DLL circuit 70, the clock-output control circuit 74, and the replica circuit 72. When the DLL ON signal DLL_ON is activated, the DLL circuit 70 generates the internal clock signal LCLK.

Furthermore, when the input oscillator enable signal DLL_OSC_Enable is activated, the DLL refresh control circuit 71 activates the DLL start signal DLL_START that indicates an update time for the DLL circuit 70 regularly at an interval indicated by the data DLL_Timing. The DLL start signal DLL_START is also supplied to the DLL circuit 70, the clock-output control circuit 74, and the replica circuit 72. The DLL circuit 70 generates the internal clock signal LCLK even when the DLL start signal DLL_START is activated. This means that the DLL circuit 70 generates the internal clock signal LCLK at regular intervals. With this process, a large shift between the phase of the internal clock signal LCLK and the phase of the external clock signal CKS can be prevented.

Regarding the self refresh, the DLL refresh control circuit 71 generates a self-refresh start signal SREF_START regularly at an interval indicated by data Self_Timing when the self-refresh command SelfEnable is activated, and outputs the generated self-refresh start signal SREF_START to a refresh circuit (REF) 53. The refresh circuit 53 is a circuit that outputs the row address in a predetermined order. Upon receiving the self-refresh start signal SREF_START, the refresh circuit 53 outputs a row address next to the last output row address to the row control circuit 51. By repeating this process, the self refresh is eventually performed for the whole row address.

The power-supply terminals 16a and 16b are terminals to which external power-supply voltages VDD and VSS are supplied, respectively. Internal-voltage generation circuits 80 to 82 generate internal voltages VPERD, VPERI2, and VPERI, respectively, based on the internal power-supply voltages VDD and VSS, and supply them to circuits in the semiconductor device 10. Specifically, the internal voltage VPERD is supplied as an operation power supply for the DLL circuit 70. Furthermore, the internal voltage VPERI2 is supplied as an operation power supply for the clock-output control circuits 73 and 74, the buffer circuit 75, and the clock tree 76. The internal voltage VPERI is supplied as an operation power supply for a number of other peripheral circuits that are not shown in the drawings.

The overall configuration of the semiconductor device 10 according to the second embodiment is as described above. The clock generation circuit 2 and the output circuit 4 are explained next in detail.

Figure 3:
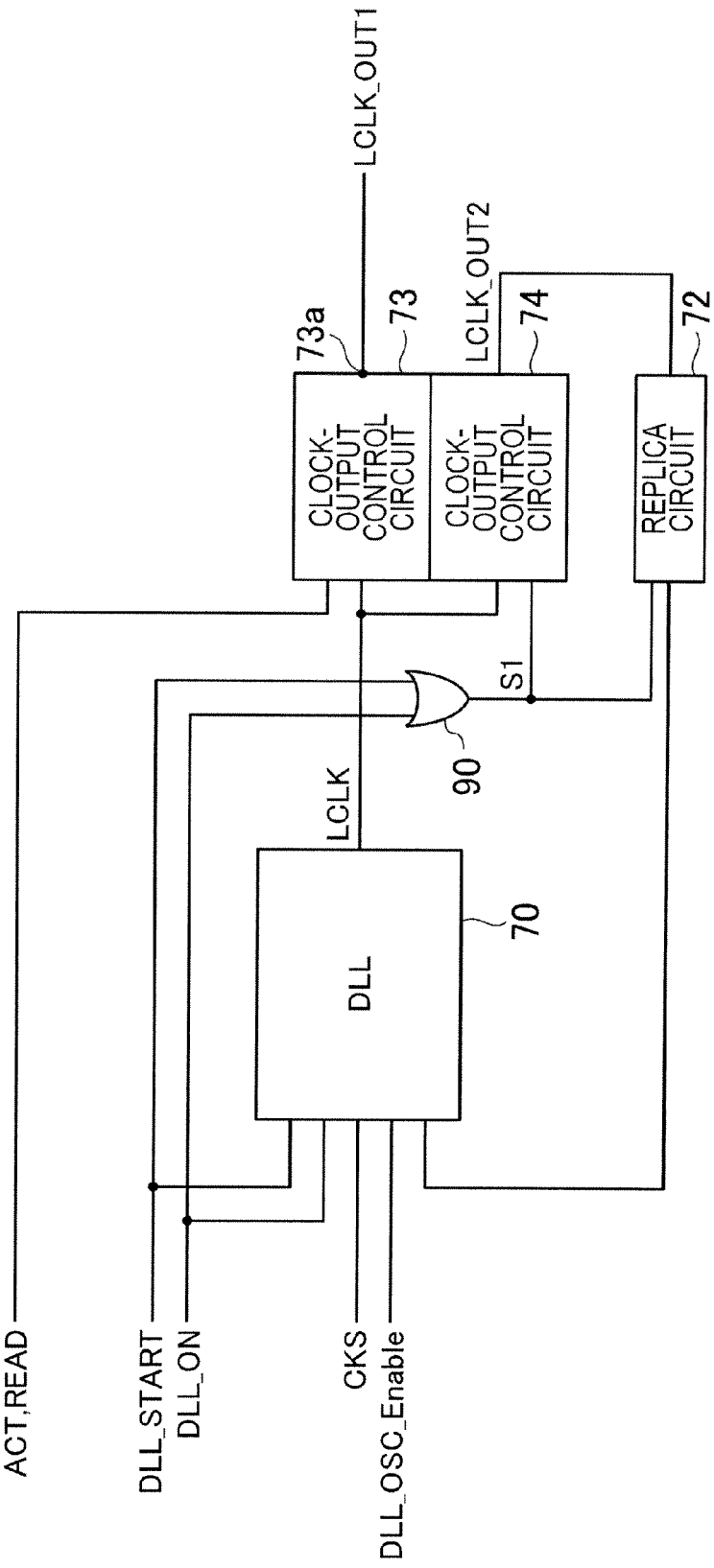
FIG. 3 is a diagram indicative of an embodiment of an overall configuration of the clock generation circuit 2 shown in FIG. 2.

Turning to FIG. 3, the clock generation circuit 2 is configured to include an OR circuit 90 as well as the circuits described above.

As described above, the external clock signal CKS, the DLL ON signal DLL_ON, the DLL start signal DLL_START, and the oscillator enable signal DLL_OSC_Enable are supplied to the DLL circuit 70. The DLL ON signal DLL_ON and the DLL start signal DLL_START are also supplied to the OR circuit 90, so that a DLL start signal S1 that is activated when either one of these signals is activated and deactivated otherwise is output from the OR circuit 90. The DLL start signal S1 is supplied to the clock-output control circuit 74 and the replica circuit 72.

As described above, the DLL circuit 70 is a circuit that receives the external clock signal CKS and generates an internal clock signal LCLK subjected to phase control with respect to the external clock signal CKS and also duty control. Specifically, although not shown in the drawings, the DLL circuit 70 is configured to include a delay circuit, a phase comparison circuit, a duty comparison circuit, a dividing circuit, and a counter circuit. The delay circuit is a circuit that delays an external clock signal to generate an internal clock signal, where the delay amount is controlled by a count value of the counter circuit. The internal clock signal LCLK generated by the delay circuit is once output to outside to be input to the clock-output control circuits 73 and 74, and, as described above, becomes the internal clock signals LCLK_OUT1 and LCLK_OUT2.

As described above, among these signals, the internal clock signal LCLK_OUT2 is returned to the DLL circuit 70 via the replica circuit 72.

Figure 4:
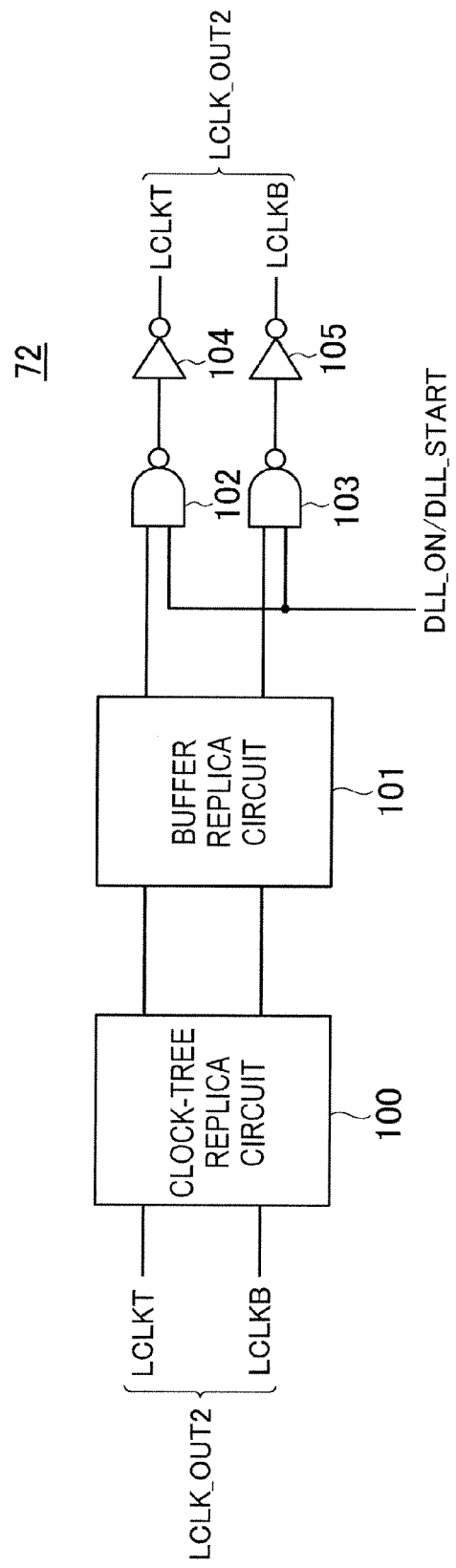
FIG. 4 is a circuit diagram indicative of an embodiment of an internal configuration of the replica circuit 72 shown in FIG. 3.

Turning to FIG. 4, the replica circuit 72 is configured to include a clock-tree replica circuit 100 that is a replica of the clock tree 76 and a buffer replica circuit 101 that is a replica of the buffer circuit 75. In this explanation, the term "replica" means a circuit that performs pseudo-replication of a delay or a waveform change applied to a transmission signal by a plurality of CMOSs included in a circuit of interest, which does not mean a circuit having the same configuration as the circuit of interest. The internal clock signal LCLK_OUT2 generated by the clock-output control circuit 74 is supplied to the clock-tree replica circuit 100 as the complementary clock signals LCLKT and LCLKB.

As shown in FIG. 4, the replica circuit 72 includes NAND circuits 102 and 103 and inverters 104 and 105. The internal clock signals LCLKT and LCLKB supplied to the clock-tree replica circuit 100 further pass through the buffer replica circuit 101, and input to the NAND circuits 102 and 103, respectively. The DLL start signal Si described above is input to the NAND circuits 102 and 103 from the OR circuit 90, by which outputs of the NAND circuits 102 and 103 are inverted signals of the internal clock signals LCLKT and LCLKB, respectively, when the DLL start signal 51 is activated, that is, the DLL circuit 70 is in an active state. On the other hand, in other cases, the outputs of the NAND circuits 102 and 103 are fixed to a high level. The outputs of the NAND circuits 102 and 103 are connected to the inverters 104 and 105, respectively, by which the internal clock signals LCLKT and LCLKB are output from the inverters 104 and 105 only when the DLL circuit 70 is in the active state.

Referring back to FIG. 3, the internal clock signal LCLK_OUT2 (the internal clock signals LCLKT and LCLKB) returned to the DLL circuit 70 via the replica circuit 72 is supplied to the phase comparison circuit and the duty comparison circuit. The phase comparison circuit compares the phase of the external clock signal CKS with the phase of the internal clock signal LCLK_OUT2, and outputs a result of comparison to the counter circuit. The duty comparison circuit compares the duty ratio of the internal clock signal LCLK_OUT2 with a predetermined value that is stored in advance, and outputs a result of comparison to the counter circuit. The counter circuit performs increment or decrement of a count value based on the results of comparison input in the above manner. The dividing circuit divides the external clock signal CKS when the oscillator enable signal DLL_OSC_Enable is activated, and outputs it as a divided clock. The update of the count value by the counter circuit is performed in synchronization with the divided clock output from the dividing circuit when either one of the DLL ON signal DLL_ON and the DLL start signal DLL_START is activated.

With the processes of the circuits described above, the output of the delay circuit becomes the internal clock signal LCLK which is synchronized with the external clock signal CKS, and of which the duty ratio is the above predetermined value.

Figure 5:
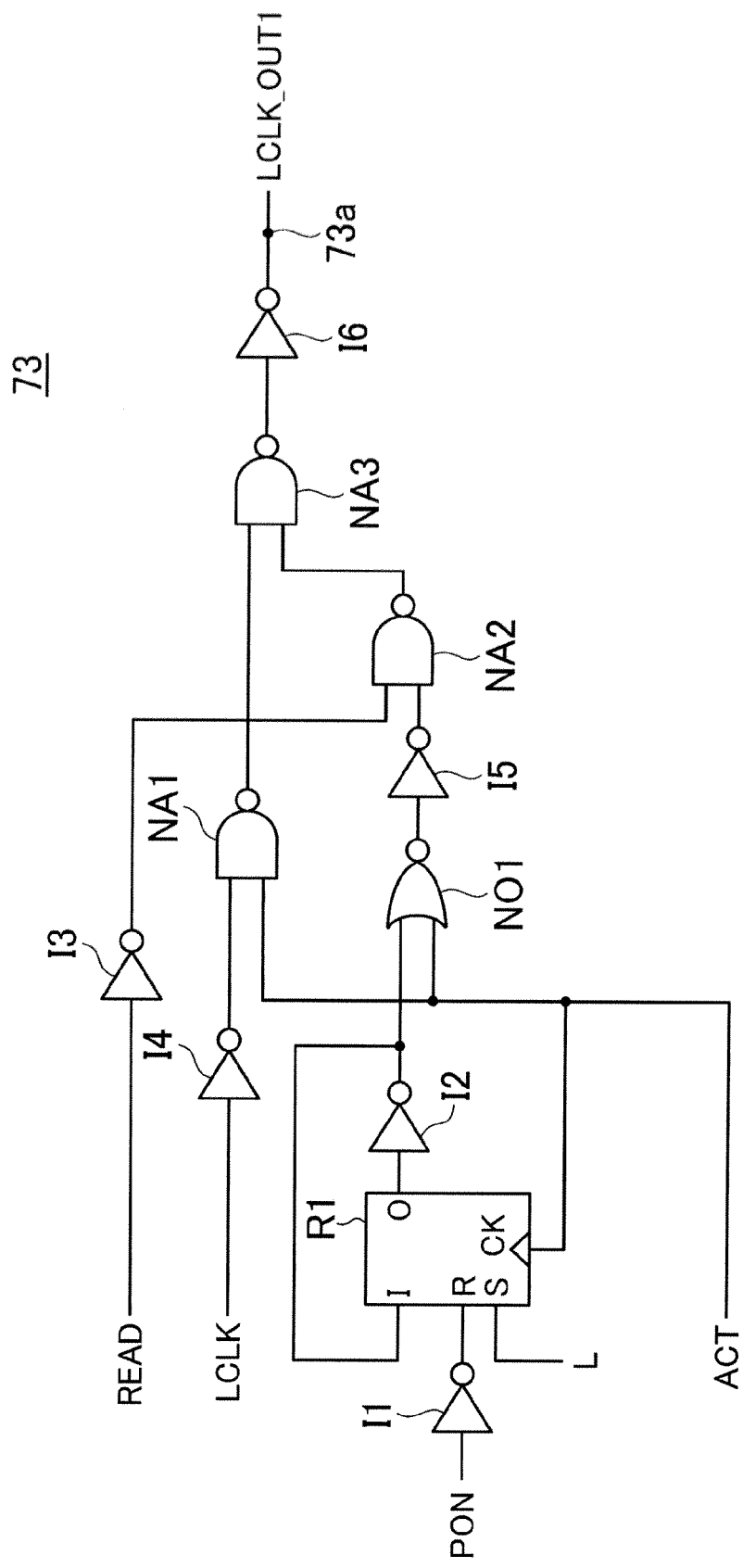
FIG. 5 is a circuit diagram indicative of an embodiment of an internal configuration of the clock-output control circuit 73 shown in FIG. 3.

Turning to FIG. 5, the clock-output control circuit 73 includes a latch circuit R1, inverters I1 to I6, NAND circuits NA1 to NA3, and a NOR circuit NO1. Among these circuits, the inverters I1 and I2 and the latch circuit R1 constitute an output-level switching circuit (first output-level switching circuit) that outputs a high level signal and a low level signal in an alternate manner in response to activation (a change from a low level to a high level) of the active command ACT (active signal). The other constituent elements constitute a mode switching circuit (first mode switching circuit) that outputs the internal clock signal LCLK to the output node 73a when the read command READ is activated and outputs a potential, which is output by the output-level switching circuit, to the output node 73a when the active command ACT is deactivated.

As shown in FIG. 5, the latch circuit R1 includes an input terminal I, a reset terminal R, a set terminal S, an output terminal O, and a clock terminal CK. The active command ACT is supplied to the clock terminal CK. To the reset terminal R, a power-on signal PON is supplied via the inverter I1. The power-on signal PON is an active high signal that is activated when the semiconductor device 10 is powered on and deactivated otherwise. A low level signal is supplied to the set terminal S in a fixed manner. An output signal of the latch circuit R1 output from the output terminal O is supplied to the input terminal I via the inverter I2.

Figure 6:
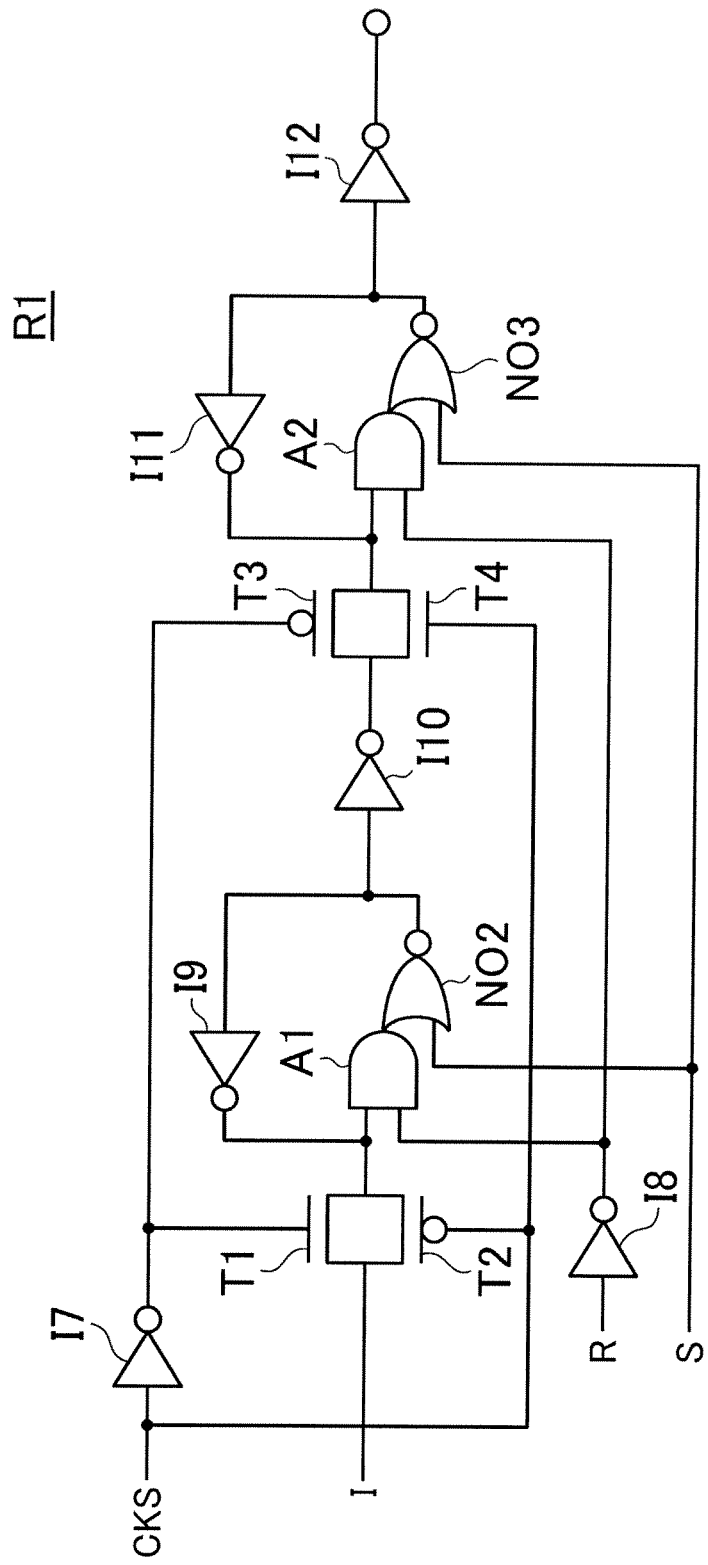
FIG. 6 is a circuit diagram indicative of an embodiment of an internal configuration of the latch circuit R1 shown in FIG. 5.

Turning to FIG. 6, the latch circuit R1 includes inverters I7 to I12, transistors T1 to T4, AND circuits A1 and A2, and NOR circuits NO2 and NO3 as its circuit elements.

The transistors T1 and T2 are an N-channel MOS transistor and a P-channel MOS transistor, respectively, and constitute a transfergate. The input terminal I is connected to an input terminal of the transfer gate. The reset terminal R is respectively connected to one input terminal of the AND circuits A1 and A2 via the inverter I8. The set terminal S is connected to one input terminal of the NOR circuits NO2 and NO3. The clock terminal CK is connected to control terminals of the transistors T2 and T4, and connected to control terminals of the transistors T1 and T3 via the inverter I7.

The output terminal of the transfer gate constituted by the transistors T1 and T2 is connected to the other input terminal of the AND circuit A1. The output terminal of the AND circuit A1 is connected to the other input terminal of the NOR circuit NO2. The output terminal of the NOR circuit NO2 is connected to input terminals of the inverters I9 and I10. The output terminal of the inverter I9 is connected to the other input terminal of the AND circuit A1, by which a feedback circuit is formed.

The transistors T3 and T4 are a P-channel MOS transistor and an N-channel MOS transistor, respectively, and constitute a transfer gate. The input terminal and the output terminal of this transfer gate is connected to the output terminal of the inverter I10 and the other input terminal of the AND circuit A2, respectively. The output terminal of the AND circuit A2 is connected to the other input terminal of the NOR circuit NO3. The output terminal of the NOR circuit NO3 is connected to input terminals of the inverters I11 and I12. The output terminal of the inverter I11 is connected to the other input terminal of the AND circuit A2, by which a feedback circuit is formed. The output terminal of the inverter I12 is the output terminal O of the latch circuit R1.

The transfer gate constituted by the transistors T1 and T2 becomes conductive when the active command ACT supplied to the clock terminal CK is in an inactive state, and otherwise disconnected. With this arrangement, when the active command ACT is in an inactive state, the AND circuit A1 loads a signal supplied to the input terminal I, generates a logical product signal of the loaded signal and an inverted signal of a signal supplied to the reset terminal R (an inverted signal of the power-on signal PON), and outputs the generated signal to the NOR circuit NO2 at the subsequent stage. On the other hand, when the active command ACT is in an active state, the AND circuit A1 generates a logical product signal of an output signal of the NOR circuit NO2 supplied via the inverter I9 and the inverted signal of the signal supplied to the reset terminal R (an inverted signal of the power-on signal PON), and outputs the generated signal to the NOR circuit NO2 at the subsequent stage. The NOR circuit NO2 generates a logical sum signal of an output signal of the AND circuit A1 and a signal supplied to the set terminal S (fixed to a low level), and outputs the generated signal to the inverters I9 and I10.

The transfer gate constituted by the transistors T3 and T4 becomes conductive when the active command ACT supplied to the clock terminal CK is in an active state, and otherwise disconnected. With this arrangement, when the active command ACT is in an active state, the AND circuit A2 loads the output signal of the inverter I10, generates a logical product signal of the loaded signal and an inverted signal of the signal supplied to the reset terminal R (an inverted signal of the power-on signal PON), and outputs the generated signal to the NOR circuit NO3 at the subsequent stage. On the other hand, when the active command ACT is in an inactive state, the AND circuit A2 generates a logical product signal of an output signal of the NOR circuit NO3 supplied via the inverter I11 and the inverted signal of the signal supplied to the reset terminal R (an inverted signal of the power-on signal PON), and outputs the generated signal to the NOR circuit NO3 at the subsequent stage. The NOR circuit NO3 generates a logical sum signal of an output signal of the AND circuit A2 and the signal supplied to the set terminal S (fixed to the low level), and outputs the generated signal to the inverters I11 and I12.

With the configuration described above, first, when the power-on signal PON is in an inactive state as an initial state, the output signal of the latch circuit R1 output from the output terminal O is fixed to a low level. At this time, an inverted signal of the output signal, that is, a high level signal, is supplied to the input terminal I via the inverter I2 shown in FIG. 5.

When the power-on signal PON is activated, a high level signal is supplied to one input terminal of the AND circuits A1 and A2 from the inverter I8. If the active command ACT is in an inactive state in the initial state, the transfer gate constituted by the transistors T3 and T4 is in a disconnected state, and a low level signal is continued to be supplied to the other input terminal of the AND circuit A2 from the inverter I11, by which the output signal of the latch circuit R1 is maintained to be a low level. On the other hand, the transfer gate constituted by the transistors T1 and T2 becomes conductive at this time, and therefore the output signal of the inverter I2 (see FIG. 5), that is, a high level signal, is supplied to the other input terminal of the AND circuit A1 via the input terminal I. Therefore, the output signal of the inverter I10 is changed to a high level.

Subsequently, when the active command ACT is activated, the transfer gate constituted by the transistors T3 and T4 is in a conductive state, and the transfer gate constituted by the transistors T1 and T2 is disconnected. With this arrangement, a high level signal is supplied to the other input terminal of the AND circuit A2, by which the output signal of the latch circuit R1 is changed to a high level. Meanwhile, the output signal of the inverter I10 is maintained to be a high level.

Thereafter, when the active command ACT is deactivated, the transfer gate constituted by the transistors I3 and T4 becomes a disconnected state again, and the transfer gate constituted by the transistors T1 and T2 becomes a conductive state again. With this arrangement, the output signal of the latch circuit R1 is maintained to be a high level, and the output signal of the inverter I10 is changed to a low level.

Subsequently, when the active command ACT is activated again, the transfer gate constituted by the transistors T3 and T4 becomes a conductive state again, and the transfer gate constituted by the transistors T1 and T2 becomes a disconnected state again. With this arrangement, a low level signal is supplied to the other input terminal of the AND circuit A2, by which the output signal of the latch circuit R1 is changed to a low level. Meanwhile, the output signal of the inverter I10 is maintained to be a low level.

Thereafter, when the active command ACT is deactivated again, the transfer gate constituted by the transistors T3 and T4 becomes a disconnected state again, and the transfer gate constituted by the transistors T1 and 12 becomes a conductive state again. With this arrangement, the output signal of the latch circuit R1 is maintained to be a low level, and the output signal of the inverter I10 is changed to a high level.

As described above, the latch circuit R1 is configured to switch the potential of the output signal in response to the activation (a change from a low level to a high level) of the active command ACT.

Referring back to FIG. 5, the output of the latch circuit R1 is connected to one input terminal of the NOR circuit NO1. The active command ACT is supplied to the other input terminal of the NOR circuit NO1. The active command ACT is also supplied to the other input terminal of the NAND circuit NA1, and the internal clock signal LCLK output from the DLL circuit 70 is input to one input terminal of the NAND circuit NA1 via the inverter I4.

One input terminal and the other input terminal of the NAND circuit NA2 are connected to the inverters I3 and I5, respectively. The read command READ and the output signal of the NOR circuit NO1 are supplied to the inverters I3 and I5, respectively. One input terminal and the other input terminal of the NAND circuit NA3 are connected to the output terminals of the NAND circuits NA1 and NA2, respectively. The output terminal of the NAND circuit NA3 is connected to the input terminal of the inverter I6, and a signal output from the output terminal of the inverter I6 becomes the output signal LCLK_OUT1 of the clock-output control circuit 73.

Figure 7:
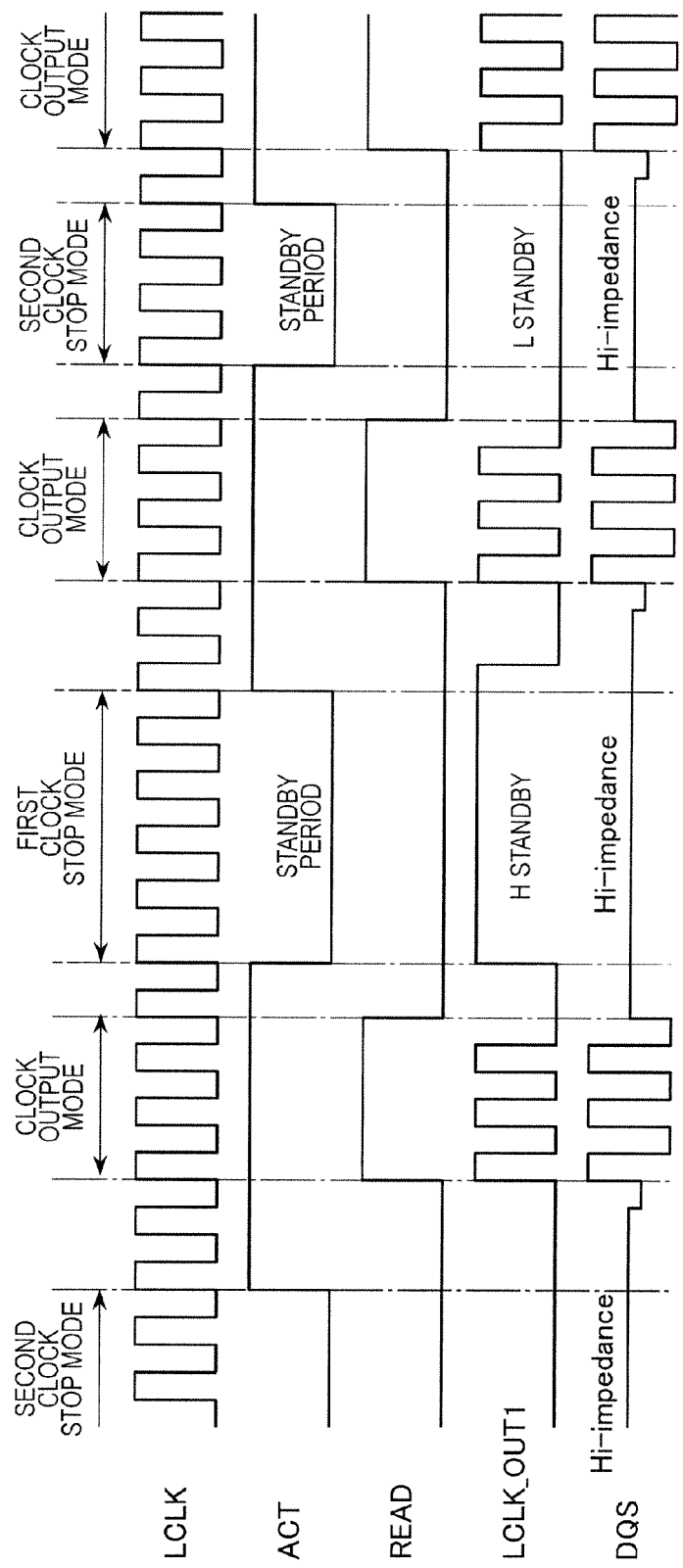
FIG. 7 is a timing chart indicative of an embodiment of a relation between a temporal change of the output signal LCLK_OUT1 and temporal changes of the active command ACT and the read command READ.

Turning to FIG. 7 is a timing chart showing a relation between a temporal change of the output signal LCLK_OUT1 and temporal changes of the active command ACT and the read command READ. FIG. 7 shows a state during an operation of the DLL circuit 70, and therefore the internal clock signal LCLK is generated through the whole period shown in FIG. 7.

As shown in FIG. 7, when the active command ACT is in an active state (a high level) and the read command READ is also in an active state (a high level), the output signal LCLK_OUT1 generated based on the internal clock signal LCLK is output from the output node 73a. This corresponds to the clock output mode explained in the first embodiment. On the other hand, when the active command ACT is in an inactive state (a standby period) and the read command READ is also in an inactive state, the output signal of the latch circuit R1 is output from the output node 73a.

Because it is configured that the output signal of the latch circuit R1 is switched in response to the activation of the active command ACT as described above, a high level and a low level appear on the output of the latch circuit R1 in an alternate manner every time it becomes the standby period (a period during which the active command ACT is in an inactive state). Therefore, the potential of the output node 73a of the clock generation circuit 2 repeats the low level and the high level in an alternate manner in the standby period. The high level corresponds to the first clock stop mode explained in the first embodiment, and the low level corresponds to the second clock stop mode explained in the first embodiment. Therefore, also in the semiconductor device 10 according to the second embodiment, aging degradation of the drive circuit 3 that is an output destination of the output signal LCLK_OUT1 is suppressed in the same manner as the semiconductor device 1 explained in the first embodiment.

As explained above, in the semiconductor device 10, the internal clock signal LCLK_OUT1 is output to the output node 73a when both the active command ACT and the read command READ are activated. Alternatively, it is possible that the internal clock signal LCLK_OUT1 is output to the output node 73a when the active command ACT is activated, which can be realized by changing a signal to be supplied to the inverter I3 from the read command READ to the active command ACT.

Figure 8:
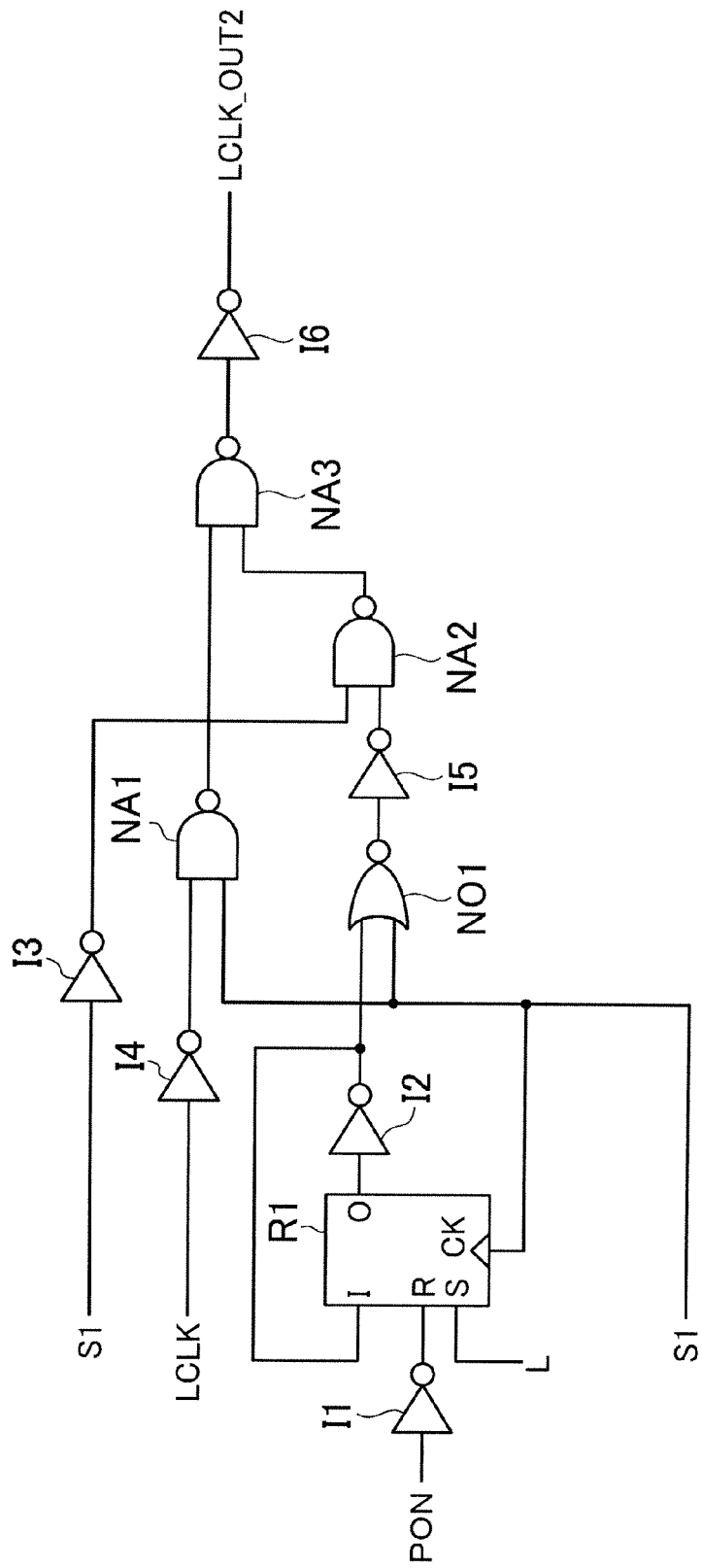
FIG. 8 is a circuit diagram indicative of an embodiment of an internal configuration of the clock-output control circuit 74 shown in FIG. 3.

Turning to FIG. 8, the internal configuration of the clock-output control circuit 74 is the same as that of the clock-output control circuit 73. However, as shown in FIG. 8, both the active command ACT and the read command READ from among the signals to be input are replaced with the DLL start signal Si that is an output of the OR circuit 90 (see FIG. 3).

In the clock-output control circuit 74, the inverters I1 and I2 and the latch circuit R1 constitute an output-level switching circuit (second output-level switching circuit) that outputs a high level signal and a low level signal in an alternate manner in response to activation (a change from a low level to a high level) of the DLL start signal S1. The other constituent elements constitute a mode switching circuit (second mode switching circuit) that outputs the internal clock signal LCLK to the replica circuit 72 when the DLL start signal S1 is activated and outputs a potential, which is output by the output-level switching circuit, to the replica circuit 72 when the DLL start signal S1 is deactivated.

Therefore, in the clock-output control circuit 74, when the DLL start signal Si is in an active state (high level), the output signal LCLK_OUT2 generated based on the internal clock signal LCLK is output to the replica circuit 72 (clock output mode). On the other hand, when the DLL start signal S1 is in an inactive state, a high level and a low level are output to the replica circuit 72 in an alternate manner (first and second clock stop modes).

The clock generation circuit 2 is as explained above. The output circuit 4 is explained next.

Figure 9:
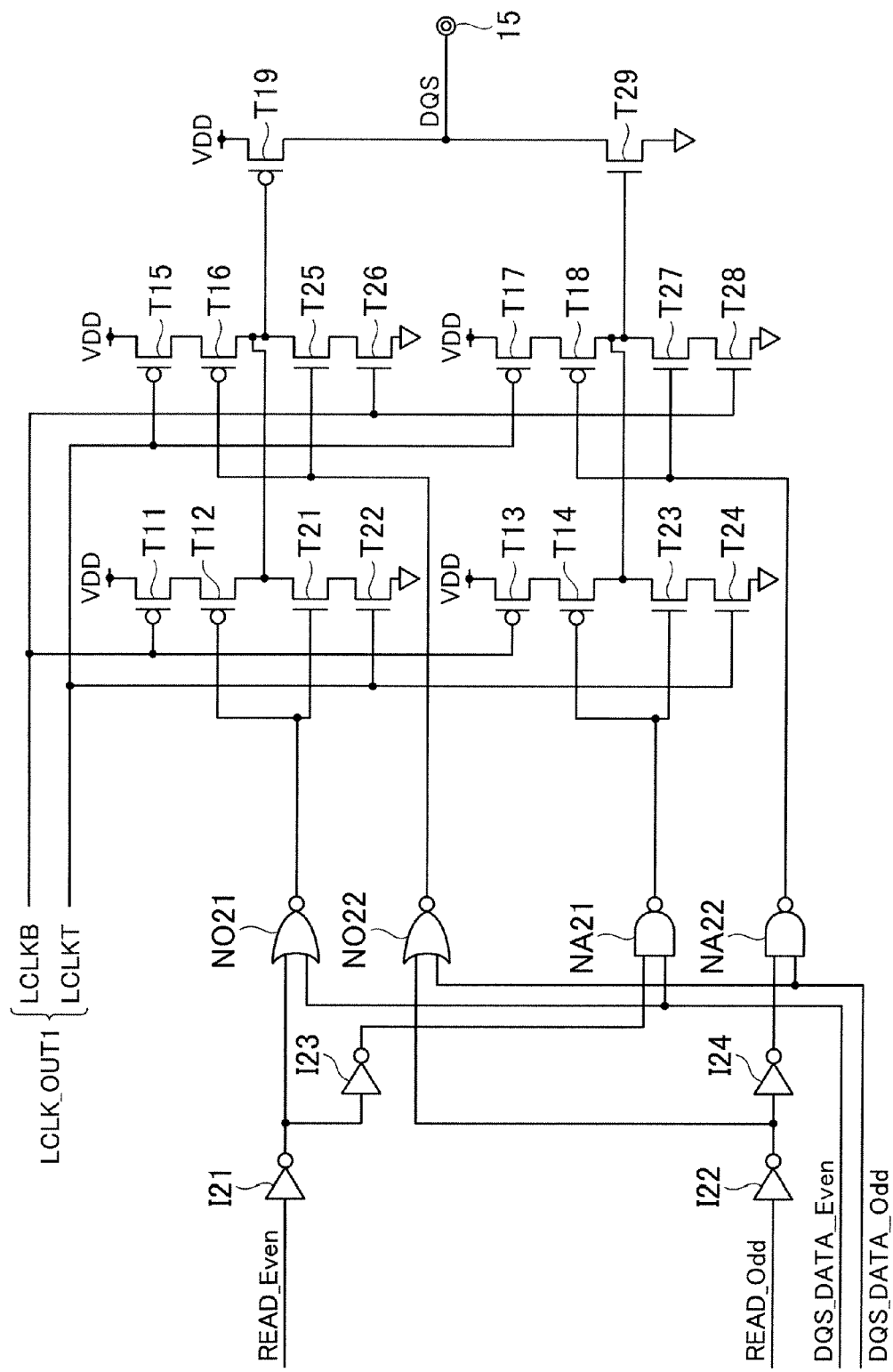
FIG. 9 is a circuit diagram indicative of an embodiment of an internal configuration of the DQS input/output circuit 65 in the output circuit 4 shown in FIG. 2.

Turning to FIG. 9, the DQS input/output circuit 65 includes inverters I21 to I24, NOR circuits NO21 and NO22, NAND circuits NA21 and NA22, P-channel MOS transistors T11 to T19, and N-channel MOS transistors T21 to T29.

Among these circuits, the data-strobe data even signal DQS_DATA_Even and the data-strobe data odd signal DQS_DATA_Odd described above are supplied to the input terminals of the inverters I21 and I22, respectively. Therefore, the input terminals of the inverters I21 and I22 constitute an input terminal for receiving the output signal. Furthermore, one control target terminals (drains) of the transistors T19 and T29 constitute an output terminal for outputting the output signal input to the input terminal. Further, the control terminals (gates) of the transistors T11, T13, T15, T17, T22, T24, T26, and T28 constitute a clock terminal for receiving the internal clock signal LCLK_OUT1 from the drive circuit 3. The internal clock signal LCLK_OUT1 is supplied as the internal clock signals LCLKT and LCLKB that are converted into the complementary signals. Each of the circuit elements is explained below in detail.

In addition to the data-strobe data even signal DQS_DATA_Even, the read even signal READ_Even is supplied to the NOR circuit NO21 and the NAND circuit NA21 from the even/odd output circuit 78 described above. However, because the read even signal READ_Even is supplied to the NOR circuit NO21 via the inverter I21, a signal actually supplied to the NOR circuit NO21 is an inverted signal of the read even signal READ_Even. On the other hand, because the read even signal READ_Even is supplied to the NAND circuit NA21 via the two inverters I21 and I23, an inverted signal of the inverted signal of the read even signal READ_Even, that is, the original read even signal READ_Even is supplied to the NAND circuit NA21.

On the other hand, in addition to the data-strobe data odd signal DQS_DATA_Odd, the read odd signal READ_Odd is supplied to the NOR circuit NO22 and the NAND circuit NA22 from the even/odd output circuit 78 described above. However, because the read odd signal READ_Odd is supplied to the NOR circuit NO22 via the inverter I22, a signal actually supplied to the NOR circuit NO22 is an inverted signal of the read odd signal READ_Odd. On the other hand, because the read odd signal READ_Odd is supplied to the NAND circuit NA22 via the two inverters I22 and I24, an inverted signal of the inverted signal of the read odd signal READ_Odd, that is, the original read odd signal READ_Odd is supplied to the NAND circuit NA22.

The transistors T11, T12, T21, and T22 are connected in series in this order between the power-supply potential VDD and the ground potential. The internal clock signal LCLKB, the output signal of the NOR circuit NO21, and the internal clock signal LCLKT are supplied to the control terminal of the transistor T11, the control terminals of the transistors T12 and T21, and the control terminal of the transistor T22, respectively.

The transistors T13, T14, T23, and T24 are also connected in series in this order between the power-supply potential VDD and the ground potential. The internal clock signal LCLKB, the output signal of the NAND circuit NA21, and the internal clock signal LCLKT are supplied to the control terminal of the transistor T13, the control terminals of the transistors T14 and T23, and the control terminal of the transistor T24, respectively.

The transistors T15, T16, T25, and T26 are also connected in series in this order between the power-supply potential VDD and the ground potential. The internal clock signal LCLKT, the output signal of the NOR circuit NO22, and the internal clock signal LCLKB are supplied to the control terminal of the transistor T15, the control terminals of the transistors T16 and T25, and the control terminal of the transistor T26, respectively.

The transistors T17, T18, T27, and T28 are also connected in series in this order between the power-supply potential VDD and the ground potential. The internal clock signal LCLKT, the output signal of the NAND circuit NA22, and the internal clock signal LCLKB are supplied to the control terminal of the transistor T17, the control terminals of the transistors T18 and T27, and the control terminal of the transistor T28, respectively.

The transistors T19 and T29 are also connected in series in this order between the power-supply potential VDD and the ground potential. The control terminal of the transistor T19 is connected to the drains of the transistors T12 and T16. The control terminal of the transistor T29 is connected to the drains of the transistors T14 and T18. The drain of the transistor T19 is connected to the data strobe terminal 15. That is, a signal that appears at the drain of the transistor T19 is output as the data strobe signal DQS.

Turning to FIG. 10, because a pair of even signal and odd signal never take the same potential, such a combination is not listed in the table.

As shown in FIG. 10, when the clock-output control circuit 73 is in the clock output mode, the internal clock signal LCLKT takes a potential of either one of a high level and a low level. In this case, as described above, the read even signal READ_Even and the read odd signal READ_Odd are taken as the same signals as the internal clock signal LCLKT and the internal clock signal LCLKB, respectively. As a result, according to the configuration of the DQS input/output circuit 65 shown in FIG. 9, as shown in FIG. 10, the data strobe signal DQS output from the data strobe terminal 15 becomes an inverted signal of the read even signal READ_Even when the internal clock signal LCLKT is a high level, and becomes an inverted signal of the read odd signal READ_Odd when the internal clock signal LCLKT is a low level.

On the other hand, when the clock-output control circuit 73 is in the first clock stop mode, the internal clock signal LCLKT is fixed to a high level. At this time, as shown in FIG. 10, the data strobe signal DQS output from the data strobe terminal 15 becomes a high impedance state (a state where both the transistors 119 and 129 shown in FIG. 9 are switched off, that is, a state where the input terminal and the output terminal of the DQS input/output circuit 65 are disconnected from each other), regardless of the internal clock signals LCLKT and LCLKB, the data-strobe data even signal DQS_DATA_Even, and the data-strobe data odd signal DQS_DATA_Odd. This is realized by setting the read even signal READ_Even and the read odd signal READ_Odd the same signals as the internal clock signal LCLKB and the internal clock signal LCLKT, respectively.

Furthermore, when the clock-output control circuit 73 is in the second clock stop mode, the internal clock signal LCLKT is fixed to a low level. Also at this time, as shown in FIG. 10, the data strobe signal DQS output from the data strobe terminal 15 becomes a high impedance state, regardless of the internal clock signals LCLKT and LCLKB, the data-strobe data even signal DQS_DATA_Even, and the data-strobe data odd signal DQS_DATA_Odd. This is also realized by setting the read even signal READ_Even and the read odd signal READ_Odd the same signals as the internal clock signal LCLKB and the internal clock signal LCLKT, respectively.

Referring back to FIG. 7, a temporal change of the data strobe signal DQS is also shown in FIG. 7. As shown in FIG. 7, the data strobe signal DQS becomes the same signal as the internal clock signal LCLK_OUT1 in the clock output mode. On the other hand, the data strobe signal DQS becomes a high impedance state in the first and second clock stop modes.

In this manner, when the clock-output control circuit 73 is in the first clock stop mode or the second clock stop mode, the data strobe terminal 15 is maintained to be in a high impedance state regardless of the internal clock signals LCLKT and LCLKB. Therefore, according to the semiconductor device 10, even if the internal clock signal LCLKT is maintained to be a high level, it does not cause a malfunction in a circuit to which the data strobe signal DQS is input (a circuit arranged outside the semiconductor device 10).

As explained above, according to the semiconductor device 10, it is possible to suppress aging degradation of the drive circuit 3 that receives the internal clock signal LCLK_OUT1 from the clock generation circuit 2, while preventing a malfunction of a circuit at the subsequent stage of the output circuit 4.

It is apparent that the present invention is not limited to the above embodiments, but may be modified and changed without departing from the scope and spirit of the invention.

Figure 11:
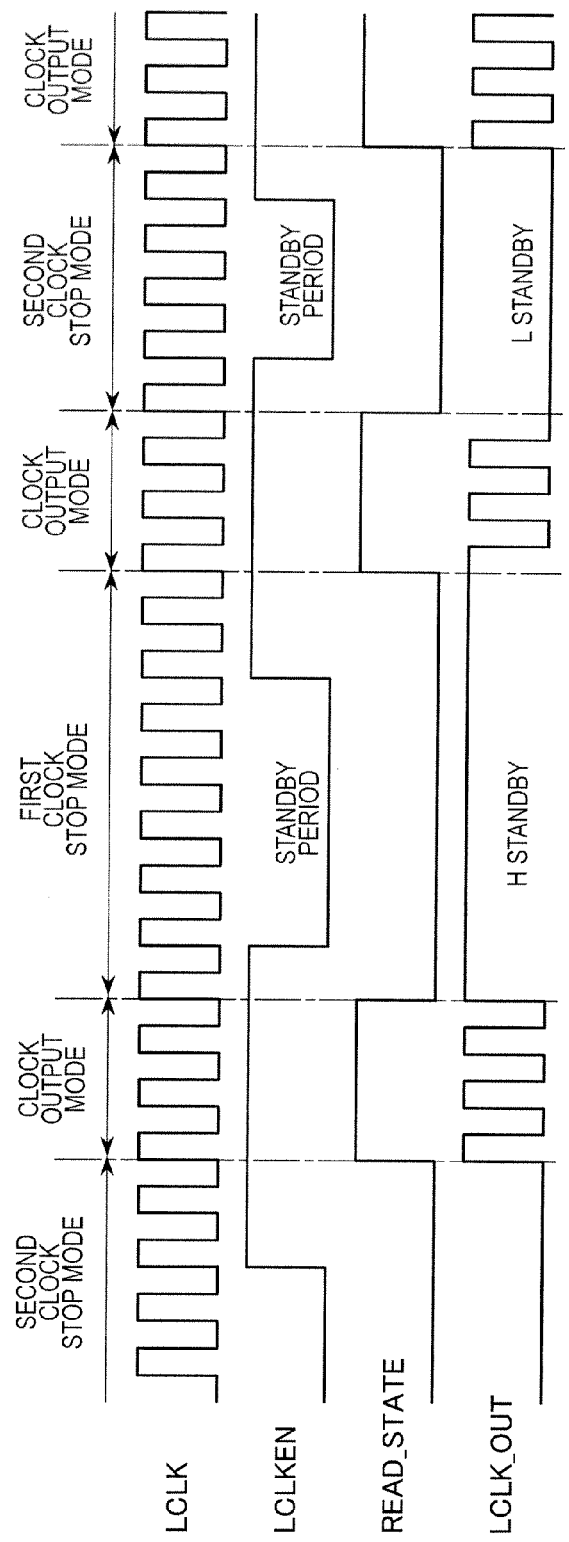
FIG. 11 is a timing chart indicative of an embodiment of a relation between a temporal change of the output signal LCLK_OUT1 and temporal changes of the active command ACT and the read command READ.

For example, in the above embodiments, the period during the active command ACT in an inactive state is set to be the first and second clock stop modes, and the period during the read command READ in an active state is set to be the clock output mode. As a result, as shown in FIG. 7, a period that does not belong to any one of the three operation modes described above occurs at the transition of the operation mode of the clock-output control circuits 73. This period can be eliminated, for example, as shown in FIG. 11, by setting the period during the read command READ is in an inactive state to be the first and second clock stop modes.

Figure 12:
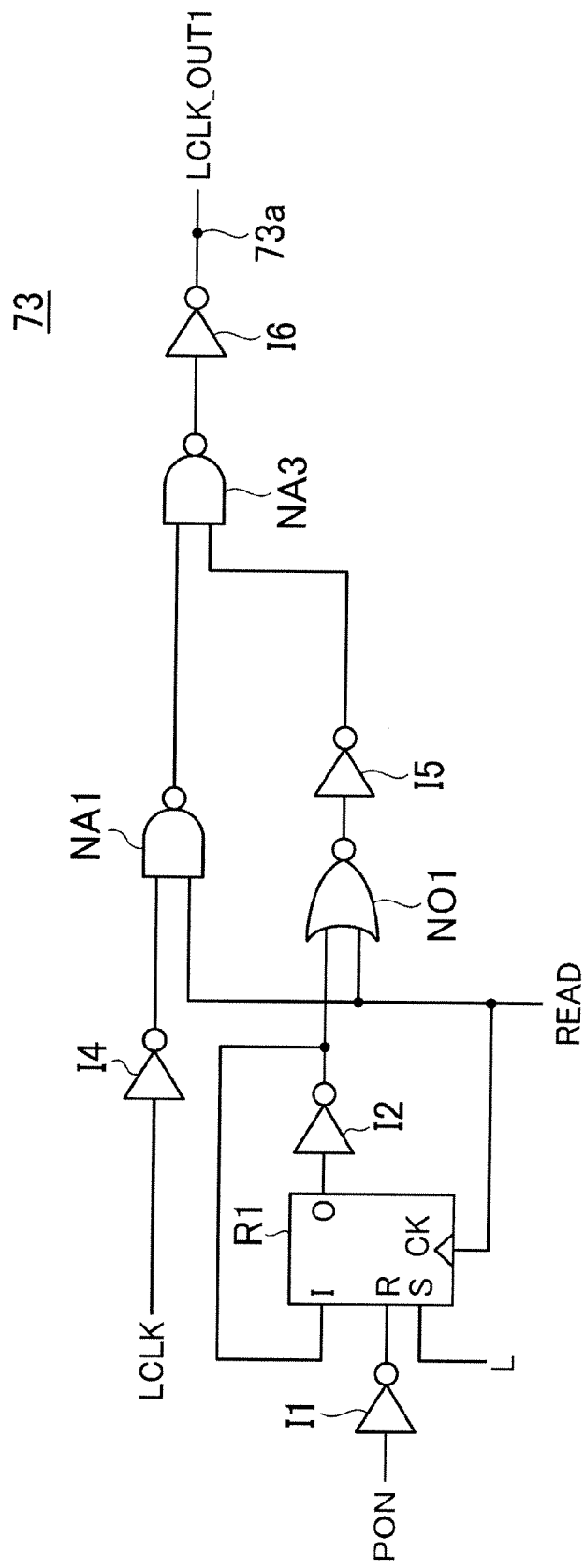
FIG. 12 a circuit diagram indicative of an embodiment of an internal configuration of the clock-output control circuit 73.

Turning to FIG. 12, the clock-output control circuit 73 sets the period during the read command READ is in an inactive state as the first and second clock stop modes. As is clear from a comparison between FIG. 5 and FIG. 12, in the present modification, the inverter I3 and the NAND circuit NA2 are omitted, and the read command READ is supplied instead of the active command ACT. The output terminal of the inverter I5 is directly connected to the input terminal of the NAND circuit NA3.

In the present modification, the output-level switching circuit constituted by the inverters I1 and I2 and the latch circuit R1 outputs a high level signal and a low level signal in an alternate manner in response to activation (a change from a low level to a high level) of the read command READ (read signal). Furthermore, the mode switching circuit constituted by the other constituent elements outputs the internal clock signal LCLK to the output node 73a when the read command READ is activated, and outputs the potential, which is output by the output-level switching circuit, to the output node 73a when the read command READ is deactivated. Therefore, the first and second clock stop modes shown in FIG. 11 are realized.

What is claimed is:

1. A semiconductor device comprising:
   a clock generation circuit generating a first clock signal and having an output node; and
   a drive circuit coupled to the output node of the clock generation circuit, wherein
   the clock generation circuit outputs the first clock signal from the output node to the drive circuit in a clock output mode, fixes a potential of the output node to a first level in a first clock stop mode, and fixes the potential of the output node to a second level that is different from the first level in a second clock stop mode.

2. The semiconductor device as claimed in claim 1, wherein the clock generation circuit is alternately brought into the first and second clock stop modes with intervention of the clock output mode between the first and second clock stop modes.

3. The semiconductor device as claimed in claim 1, wherein
   the clock generation circuit includes a DLL circuit generating a second clock signal, and a first clock-output control circuit outputting the first clock signal to the output node based on the second clock signal supplied from the DLL circuit, and
   the first clock-output control circuit outputs the first clock signal in the clock output mode, fixes the potential of the output node to the first level in the first clock stop mode, and fixes the potential of the output node to the second level in the second clock stop mode.

4. The semiconductor device as claimed in claim 3, wherein
   the clock generation circuit outputs the first clock signal when an active signal that is externally supplied from the semiconductor device is activated, and
   the first clock-output control circuit includes:
      a first output-level switching circuit alternately outputting an output signal having third and fourth levels in response to an activation of the active signal; and
      a first mode switching circuit outputting the first clock signal to the output node when the active signal is activated, the first mode switching circuit fixing the potential of the output node based on a level of the output signal from the first output-level switching circuit when the active signal is deactivated.

5. The semiconductor device as claimed in claim 3, further comprising:
   a memory cell array;
   a data input/output terminal; and
   an output circuit that outputs read data read from the memory cell array to the data input/output terminal in synchronization with the first clock signal generated by the clock generation circuit, wherein
   the clock generation circuit outputs the first clock signal when a read signal that indicates an operation timing of the output circuit is activated, and
   the first clock-output control circuit includes:
      a first output-level switching circuit alternately outputting an output signal having third and fourth levels in response to an activation of the read signal; and
      a first mode switching circuit outputting the first clock signal to the output node when the read signal is activated, the first mode switching circuit fixing the potential of the output node based on a level of the output signal from the first output-level switching circuit when the read signal is deactivated.

6. The semiconductor device as claimed in claim 3, wherein
   the clock generation circuit further includes a second clock-output control circuit outputting a third clock signal based on the second clock signal supplied from the DLL circuit, and a replica circuit having substantially the same electrical characteristics of the drive circuit, the replica circuit outputting a fourth clock signal based on the third clock signal,
   the DLL circuit generates the second clock signal, when a DLL start signal that is externally supplied from the semiconductor device is activated, by delaying an external clock signal based on a phase difference between the external clock signal and the fourth clock signal output from the replica circuit, and
   the second clock-output control circuit outputs the third clock signal to the replica circuit when the DLL start signal is activated, and fixes a potential of the third clock signal to either one of the first and second levels.

7. The semiconductor device as claimed in claim 6, wherein the second clock-output control circuit includes:
   a second output-level switching circuit alternately outputting an output signal having third and fourth levels in response to an activation of the DLL start signal; and
   a second mode switching circuit outputting the third clock signal to the replica circuit when the DLL start signal is activated, the second mode switching circuit fixing the potential of the third clock signal based on a level of the output signal from the second output-level switching circuit when the DLL start signal is deactivated.

8. The semiconductor device as claimed in claim 1, wherein
   the drive circuit outputs a second clock signal based on the first clock signal,
   the semiconductor device further comprises an output circuit including an input terminal receiving an output signal, an output terminal outputting the output signal supplied from the input terminal, and a clock terminal receiving the second clock signal from the drive circuit, the output circuit being configured to output the output signal from the output terminal in synchronization with the second clock signal supplied from the clock terminal, and
   the output circuit electrically disconnects the output terminal from the input terminal when the clock generation circuit is in either one of the first and second clock stop modes.

* * * * *